United States Patent
Gunthorpe et al.

(10) Patent No.: US 6,268,738 B1
(45) Date of Patent: *Jul. 31, 2001

(54) METHOD AND APPARATUS FOR HIGH-SPEED SCANNING OF ELECTROMAGNETIC EMISSION LEVELS

(75) Inventors: Gary E. Gunthorpe; Don E. James, both of Calgary (CA)

(73) Assignee: Emscan Corporation, Calgary (CA)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/000,231
(22) PCT Filed: Oct. 8, 1996
(86) PCT No.: PCT/CA96/00668
  § 371 Date: May 6, 1998
  § 102(e) Date: May 6, 1998
(87) PCT Pub. No.: WO97/17617
  PCT Pub. Date: May 15, 1997

(30) Foreign Application Priority Data

Nov. 7, 1995 (CA) .................................................. 2162347

(51) Int. Cl.$^7$ ................................................. G01R 31/28
(52) U.S. Cl. ............................................. 324/750; 324/501
(58) Field of Search .............................. 324/95, 750, 501, 324/537, 538, 639; 702/85, 75, 76

(56) References Cited

U.S. PATENT DOCUMENTS

| 4,829,238 | | 5/1989 | Goulette et al. . |
| 5,006,788 | | 4/1991 | Goulette et al. . |
| 5,028,866 | * | 7/1991 | Wiese ..................................... 324/95 |
| 5,218,294 | | 6/1993 | Soiferman . |
| 5,300,879 | * | 4/1994 | Masuda et al. ......................... 324/95 |
| 5,424,633 | * | 6/1995 | Soiferman ............................. 324/639 |

FOREIGN PATENT DOCUMENTS

| 1286724 | 7/1991 | (CA) . |
| 2161292 | 4/1997 | (CA) . |
| 0 239 251 A3 | 9/1987 | (EP) . |
| 0 379 050 A1 | 7/1990 | (EP) . |
| 0 439 157 A2 | 7/1991 | (EP) . |
| 0 527 321 A1 | 2/1993 | (EP) . |
| WO 94/08248 | 4/1994 | (WO) . |

* cited by examiner

Primary Examiner—Vinh P. Nguyen
(74) Attorney, Agent, or Firm—Michael J. Mehrman; Gardner Groff Mehrman & Josephic P.C (57) ABSTRACT

A method and apparatus for high-speed scanning of electromagnetic emission levels includes a synchronizer for synchronizing scanning of a device under test with digitizing a output video signal from a spectrum analyzer. The synchronizer can be responsive to a synchronization signal from the device under test or can generate a synchronization signal to the device under test. Methods for calibrating the level and frequency of the video output signal are provided. Once calibrated the high-speed scanning can be used to develop single probe multifrequency/time scans yielding amplitude versus frequency and time plots, and single frequency multiple probe/time scans yielding amplitude versus space and time plots.

14 Claims, 8 Drawing Sheets

METHOD AND APPARATUS FOR HIGH-SPEED SCANNING OF ELECTROMAGNETIC EMISSION LEVELS

FIELD OF THE INVENTION

The present invention relates to a method of and apparatus for high-speed scanning of printed electromagnetic field levels and is particularly concerned with testing circuit packages and like devices.

BACKGROUND OF THE INVENTION

An important tool in circuit board design is the ability to easily and accurately locate and measure electromagnetic emissions from an operating circuit board. The prior art electronic emission monitors are represented by Canadian Letters Patent 1,286,724 assigned to Northern Telecom Limited, granted on Jul. 23, 1991; U.S. Pat. No. 4,829,238 granted on May 9, 1989; U.S. Pat. No. 5,006,788 granted on Apr. 9, 1991; and, U.S. Pat. No. 5,218,294. These patents describe a method and apparatus for monitoring electromagnetic emission levels from operating printed circuit boards.

The prior art enabled the user to carry out two types of scans: spectral, that is, signal strength relative to the frequency of the scanner, and spatial, that is, signal strength relative to the position of the signal on the printed circuit board. The spectral scan retains only the highest value observed at each frequency point, regardless of the probe, and the display is, therefore, merely a profile of peak electromagnetic amplitudes plotted against frequency. All other readings are discarded. A spatial scan takes a reading of the signal level at the designated frequency, for each probe within the selected scan area. The scan results are retained in a display file which provides a color coded map of the current flows (signal strength) in the scan area at the defined frequency. The amount of time required to complete the scan is in the range of 95 seconds.

The disadvantages and limitations associated with the prior art apparatus relate to the fact that it cannot scan the board under test fast enough for use in production line testing. To be effective in such an application requires an method and apparatus for gathering spectral information from all locations of the printed circuit board under test in much less than one second.

SUMMARY OF THE INVENTION

An object of the present invention is to provide an improved method and apparatus for monitoring electromagnetic field levels from printed circuit board.

In accordance with an aspect of the present invention there is provided an apparatus for testing a device for electromagnetic field therefrom, the apparatus comprising: probe means positionable in a plurality of predetermined positions immediately adjacent to the device, said predetermined positions having a known spatial arrangement; addressing means for successively addressing the probe means at each predetermined position; a receiver connected to said addressing means for measuring current induced in the probe means by electromagnetic field from respective immediate adjacent regions of the device under test; signal processing means for analyzing electrical outputs from the probe means to obtain a measure of electromagnetic field levels immediately adjacent the device under test associated with each predetermined position; spectrum analyzer means to gather and analyze spectral information; digital computing means to convert the analog output of the spectrum analyzer means to a digital output; calibration means to calibrate the digital output.

In a further embodiment of the present invention, the spectrum analyzer output is connected to an analog to digital converter via the "video out" output socket.

In yet another embodiment of the present invention, the initial analog to digital conversion is triggered to start the sweep of the printed circuit board under test by the electromagnetic scanning apparatus thereby synchronizing the operation of the device under test with the scanning apparatus allowing the collection of scanning data with respect to time.

In an embodiment of the present invention, a spectral scan of the device under test is obtained resulting in a display of the profile of peak amplitudes plotted against frequency. Several peaks are chosen by the computer system and the frequency of each peak is recorded. From the frequencies of these peaks, a piece wise linear frequency calibration curve is produced.

Another aspect of this invention is directed to a method of high-speed scanning of electromagnetic field levels comprising the steps of: placing a device under test immediately adjacent to a probe means which comprising a plurality of probes, each probe having a predetermined position within the probe means; addressing a first probe of the plurality of probes, then synchronizing a spectrum analysis sweep to commence at the same point in time of the activity of the device under test; measuring electromagnetic field levels from the device under test as detected by the first probe, and, using a spectrum analyzer, sweep across a desired frequency range generating a video output signal; digitizing this video output signal, level calibrating the digitized video output signal and saving the individual data so obtained. Furthermore, these steps can be optionally repeated for each probe of the plurality of probes as required and the steps between the individual data of the digitized data set frequency calibrated, and optionally waiting one sample time more, followed by repeating the above steps for each possible sample time for each probe of the plurality of probes, and displaying the calibrated data set.

In another embodiment of the present invention a method is provided whereby measured level of electromagnetic radiation from the device under test is calibrated. The "Cal Out" output of the spectrum analyzer is serially connected via an attenuating means of 40 dB to the spectrum analyzer input.

Particularly for testing a device for electromagnetic field therefrom, the apparatus can further include a memory at which circuit layout design data is stored, and means for inputting said circuit layout design data to the controller means, said controller means being operable to generate a circuit layout map from the circuit layout design data and said display being means operable simultaneously to display said map of electromagnetic field level measures and said circuit layout with said maps superimposed.

In accordance with the present invention, a spectral analyzer is placed in series with the electromagnetic probe array.

In accordance with another embodiment of the invention, the "video out" terminal of the spectral analyzer is connected to a high speed analog to digital (A/D) converter.

By using a spectral-spatial scan, the present invention seeks to overcome the disadvantages found in the prior art. The use of a spectral-spatial scan makes it possible to measure electromagnetic fields from devices under test orders of magnitude faster than prior art scanner apparatus.

The increased scanning speeds enable the user to build large data structures of scan data. In addition, the systems provide powerful manipulative, comparative and analytical tools which allows multiple perspectives of the scan results, thus establishing a new level of visualization capabilities.

A further objective of the present invention is to provide a device of the character herewithin described which permits the production of improved products; significantly reduces pre-compliance times with a consequent reduction in the time to market of the device under test; reduced re-engineering or modification costs; cost effective means for ensuring on-going electromagnetic field compliance with preset standards; and, minimized life-cycle costs for the product. The spectral-spatial scan system provide a low cost, automated, non-contacting, testing of a devices quality and a testing of their performance on the manufacturing line.

BRIEF DESCRIPTION OF DRAWINGS

The present invention will be further understood from the following description with references to the drawings in which.

DETAILED DESCRIPTION

Figure 1:
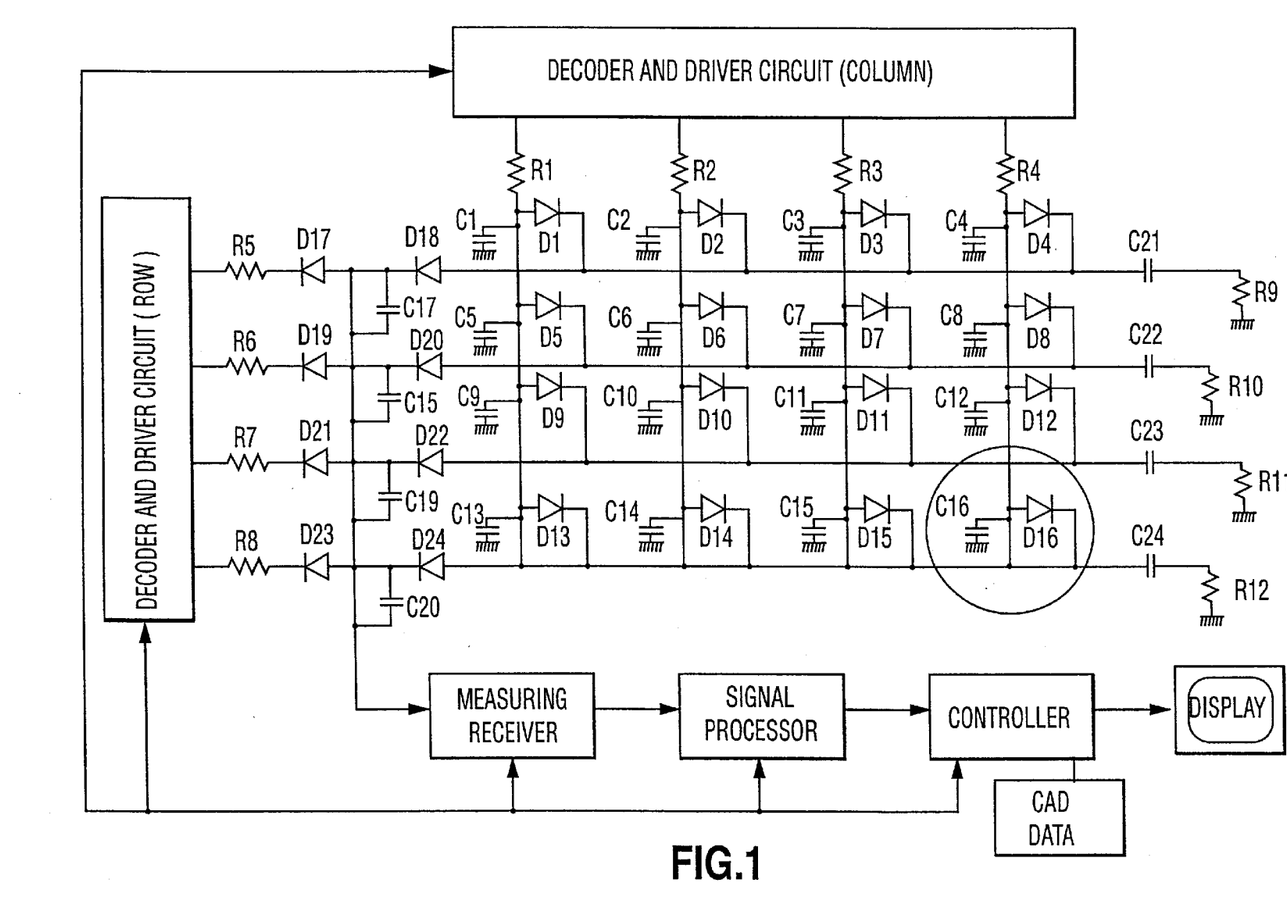
FIG. 1 illustrates known art scanning apparatus.

In the known apparatus, as shown in FIG. 1, the method for testing a device for electromagnetic fields therefrom, the method comprising positioning an array of electromagnetic field monitoring probes occupying predetermined positions within the array immediately adjacent to the device under test, successively addressing the probes to measure detected current induced in the probes by electromagnetic field from respective immediately adjacent regions of the device under test, and analyzing electrical outputs from the probes to obtain a position-dependent measure of electromagnetic fields immediately adjacent to the device under test.

For example, a co-pending device described in Canadian Patent Application 2,161,292 has a electromagnetic sweep range of plus one gigahertz (+1 GHz). Using a 100 KHz bandwidth, a minimum of 20,000 readings would be necessary to cover all of the information contained in the electromagnetic spectrum under analysis. The internal digitizer of the spectrum analyzer on the prior art apparatus would require 34 separate sweeps with each sweep taking 100 msec to complete. This speed is not adequate for high speed production applications. One method to increase the speed of the spectral scanner is to connect an external high-speed digitizer. However, the only available output is the "video out" output of the spectrum analyzer. This output is not calibrated and therefore would yield inconsistent scanning results.

Figure 2:
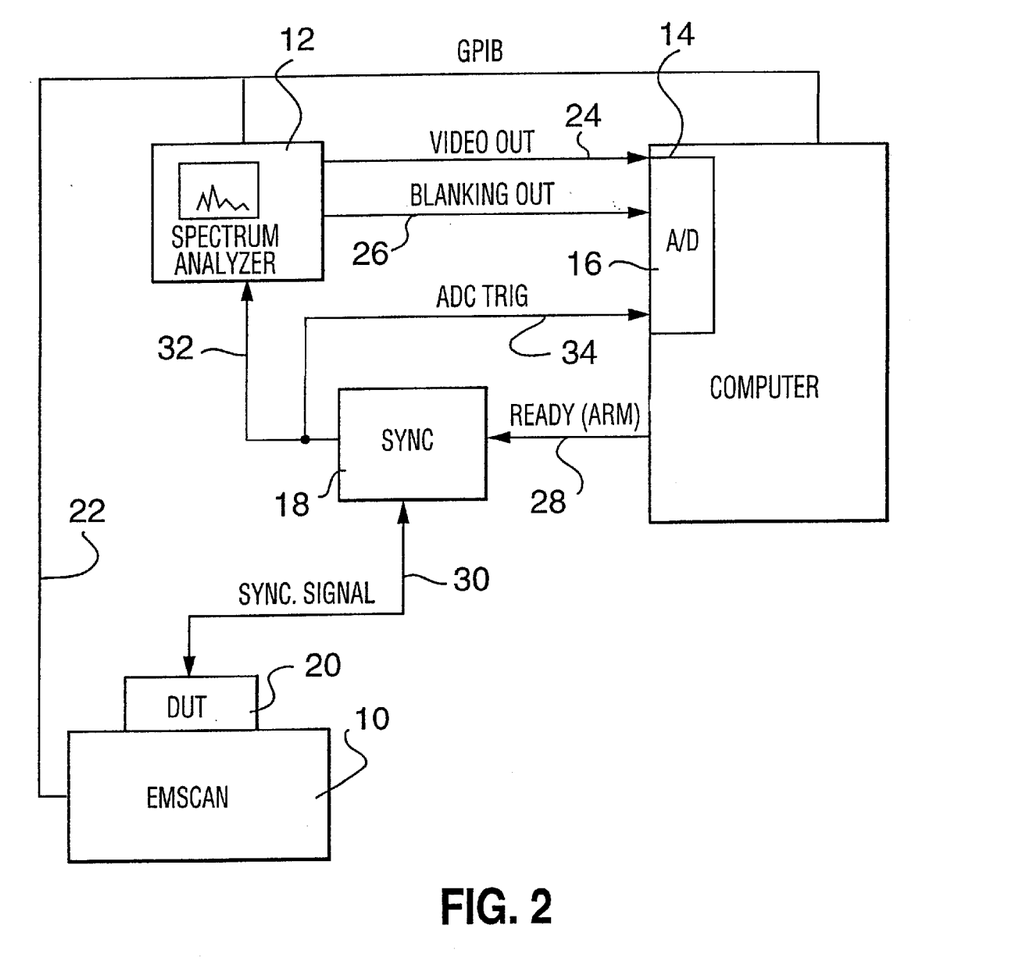
FIG. 2 illustrates, in a block diagram, a high-speed scanning apparatus in accordance with an embodiment of the present invention.

Referring to FIG. 2, there is illustrated in a block diagram, a high-speed scanning apparatus in accordance with an embodiment of the present invention. The high-speed scanning apparatus includes an electromagnetic scanning (EMSCAN) probe array 10, a spectrum analyzer 12, a computer 14 having an analog-to-digital (A/D) converter 16, a synchronization (SYNC) block 18 for testing the electromagnetic radiation emitted by the device under test (DUT) 20. The EMSCAN probe array 10 is connected to the spectrum analyzer 12 and the computer 14 via an IEEE 488 bus 22. The spectrum analyzer 12 is connected to an A/D connecter via a video out line 24 and a blanking out line 26. The computer 14 is connected to the SYNC block 18 via a line 28 to provide a ready or arm signal thereto. The SYNC block 18 has an input/output port connected to the DUT 20, for receiving from or sending to the DUT 20, a sync signal via a sync signal line 30. The SYNC block 18 has an output coupled to the spectrum analyzer 12 via a first trigger line 32 and to the A/D converter 16 via a second trigger line 34.

In operation, a high-speed scan is accomplished by externally digitizing the video out signal, provided on the video out line 24, in the A/D converter 16. The digitizing process is initiated in synchronization with the spectrum analyzer. Optionally, the synchronization signal can be applied to the device under test (DUT) 20 or alternatively, can be received from the DUT 20. The synchronization is accomplished by the SYNC block 18. The SYNC block 18 first receives a ready signal form the computer 14, then in one mode of operation sends a sync signal to the DUT 20 and trigger signals to the spectrum analyzer 12 and A/D converter 16. Thus, activity in the DUT 20 and both the spectrum analyzer and the A/D converter are synchronized.

In another mode of operation, the armed SYNC block 18 receives a synchronization signal, generated by the DUT 20, and in response thereto, sends trigger signals to the spectrum analyzer 12 and the A/D converter 16. The A/D converter 16 uses the video blanking signal from the spectrum analyzer 12 to stop its digitization process. The spectrum analyzer, for example, may be a Hewlett-Packard 8594E.

In order to consistently map a predetermined number of data points for each sweep of the spectrum analyzer, data interpolation or decimation is performed upon the digitized data output from the A/D converter. For example, at a sampling rate of 100 kHz and a sweep time of one second, each sweep of the spectrum analyzer would provide 100,000 data points. However, the blanking signal used by the A/D converter 16 to stop digitizing data likely does not have sufficient accuracy to ensure that precisely 1100,000 data points are generated. In this event, the data are interpolated or decimated such that exactly the predetermined number of data points or samples result from each sweep.

The step of the high-speed measurement process are summarized in the following chart:

CHART A
HIGH-SPEED MEASUREMENT PROCESS

Step  Process

1. Setup the spectrum analyzer and read back the sweep time. (FIG. 2)
2. Select the first Emscan probe.
3. Set the "Ready Line" and arm the Synchronizer.
4. The synchronizer waits until the DUT is ready or runs immediately for unsynchronized scans. The spectrum analyzer's sweep and the Analog to Digital Converter (A/D) are then triggered.
5. The A/D digitizes the signal at the spectrum analyzer's "Video Out" and "Blanking Out" for a duration of the sweep time plus a percentage.
6. Determine the end of sweep from the digitized blanking data.
7. Linearly rescale the 'Video Out' data to correct to the number of digitized points desired.
8. Apply the Level Calibration formula to the data. Note: this formula is only determined from time to time (once per month).
9. Step to the next Emscan probe and repeat step 3–8 until the last probe is completed. The spectral data for each probe is stored in an array.
10. Run the Frequency calibration algorithm.
11. Display the data.

Figure 3:
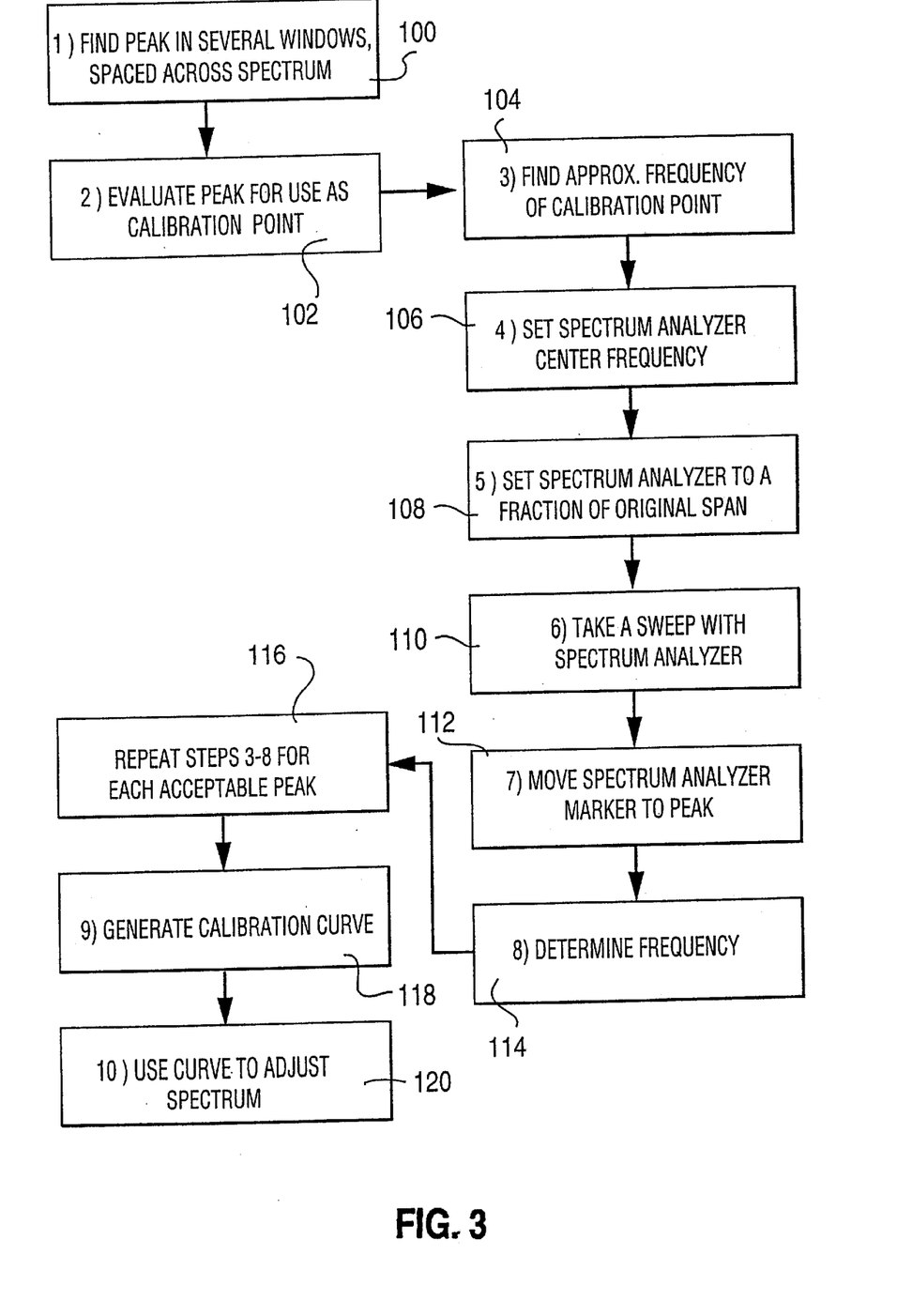
FIG. 3 illustrates in a flow chart a calibration method in accordance with an embodiment of the present invention.
Figure 4:
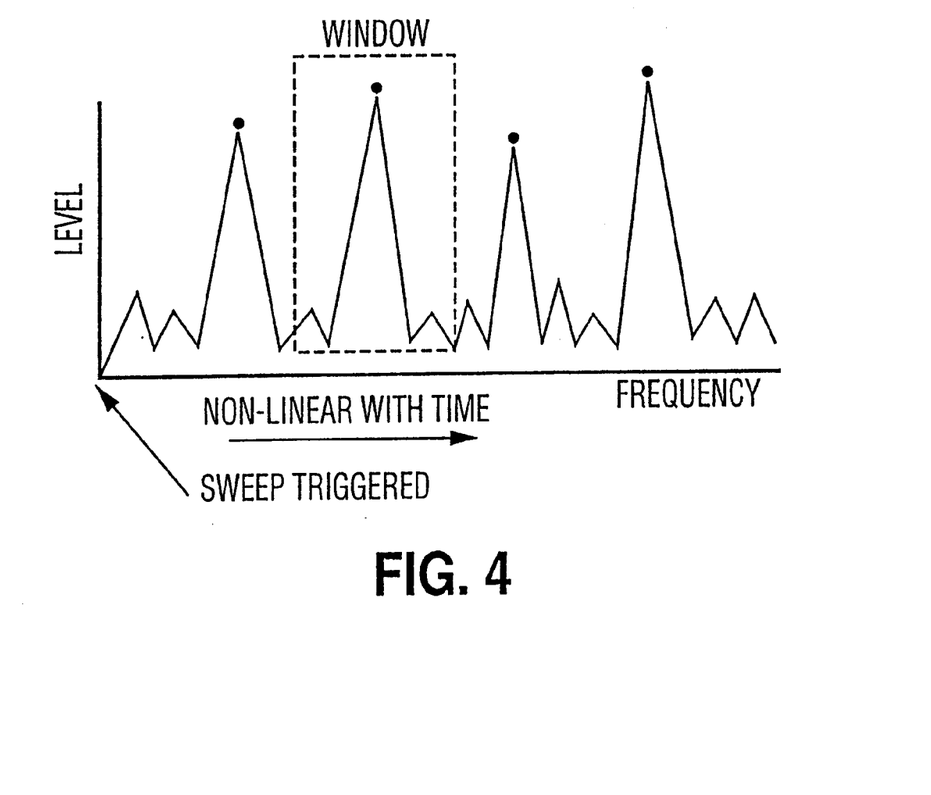
FIG. 4 graphically illustrates the amplitude verses frequency spectrum collected by the apparatus of FIG. 2 with a window superimposed upon a peak in the spectrum in accordance with the method of FIG. 3.
Figure 5:
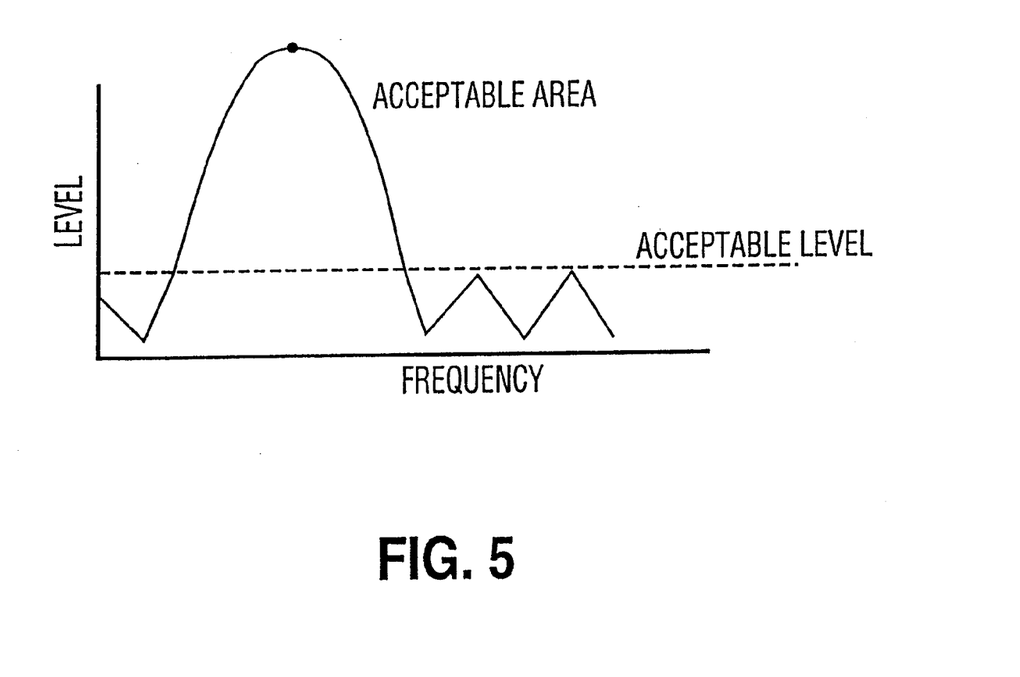
FIG. 5 graphically illustrates evaluation of a peak for suitability as a calibration point in accordance with the method of FIG. 3.
Figure 6:
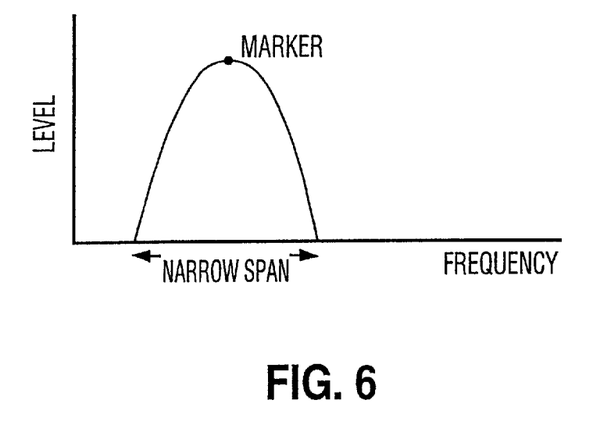
FIG. 6 graphically illustrates narrow span sweep of the peak in accordance with the method of FIG. 3.
Figure 7:
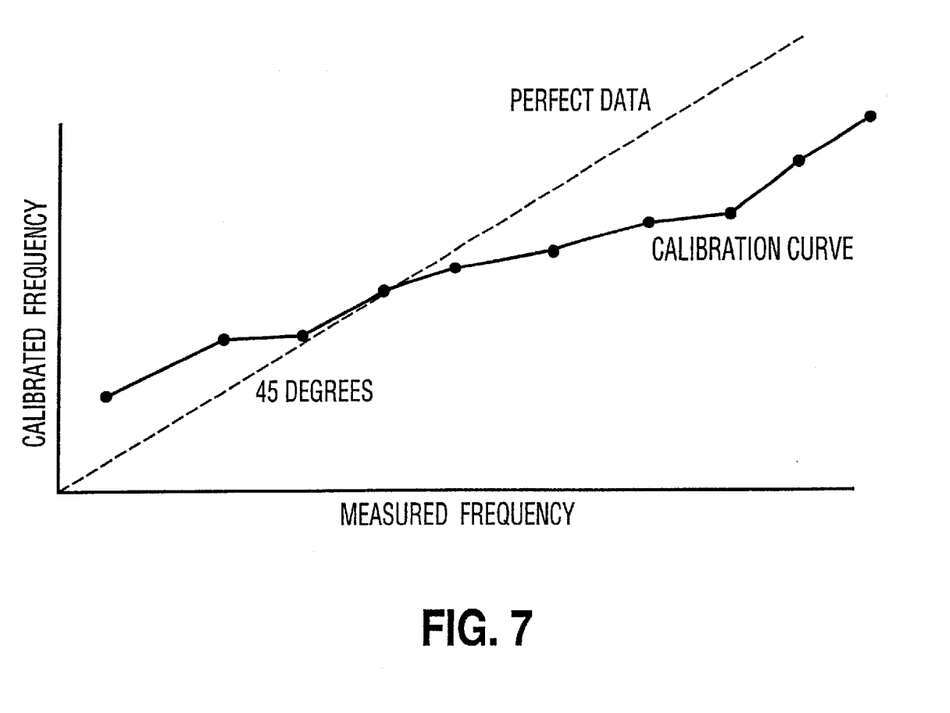
FIG. 7 illustrates a sample piece-wise linearization curve used by the method of FIG. 3 to calibrate the frequency of the collected spectrum data.

Referring to FIG. 3, there is illustrated in a flow chart, a calibration method in accordance with an embodiment of the present invention. Once the data has been collected in accordance with steps 1–9 of Chart A, at step 10, the frequency calibration method of FIG. 3 is applied as follows. The first step as represented by a block 100 is to find the highest peak in each of several windows, evenly spaced across the frequency range as illustrated in FIG. 4. Then, as represented by a block 102, based upon a minimum level and the area under the peak evaluate the peaks in each window for acceptability for use as a calibration point as illustrated in FIG. 5. Then as represented by a block 104, find the uncalibrated frequency of the first acceptable peak. Then, as represented by a block 106, set the spectrum analyzer center frequency to that frequency. Then, as represented by a block 108, set the spectrum analyzer span to a small percentage of the original span. Then, as represented by a block 110, take a sweep with the spectrum analyzer. As represented by a block 112, move the spectrum analyzer's marker to the peak, as illustrated in FIG. 6. In a block 114 determine the frequency of that marker (peak). At a block 116 repeat from steps 3–8 for each acceptable peak. Then, as represented by block 118, generate a piece-wise linearization curve from the measured values, as illustrated in FIG. 7. Finally, as represented by a block 120, use this curve to adjust the displayed spectrum to the calibrated frequency.

Figure 8:
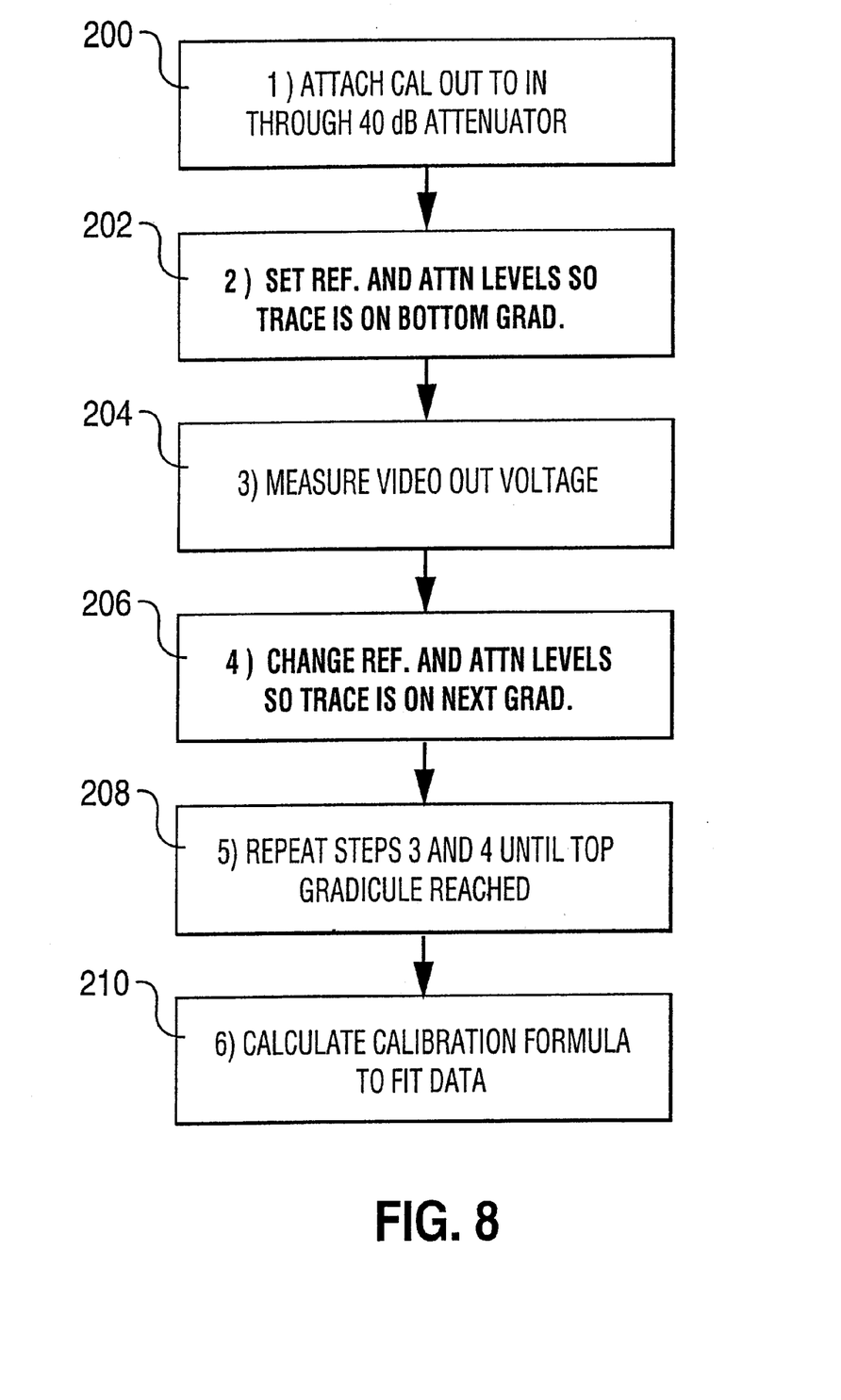
FIG. 8 illustrates in a flow chart a method of spectrum amplitude calibration in accordance with an embodiment of the present invention.
Figure 9:
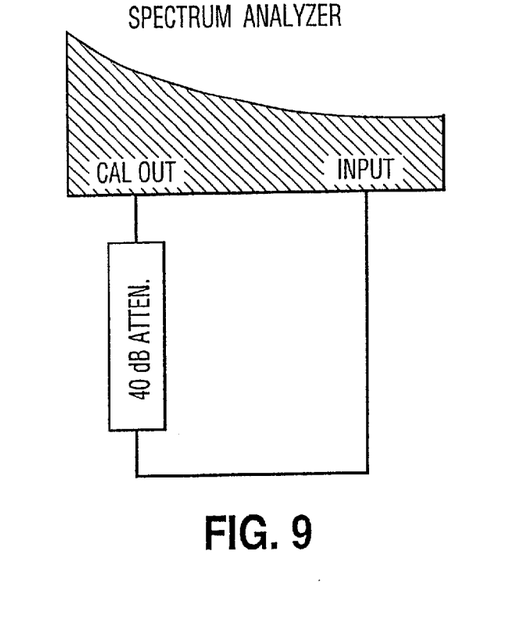
FIG. 9 illustrates an apparatus set-up used for the method of FIG. 8.
Figure 10:
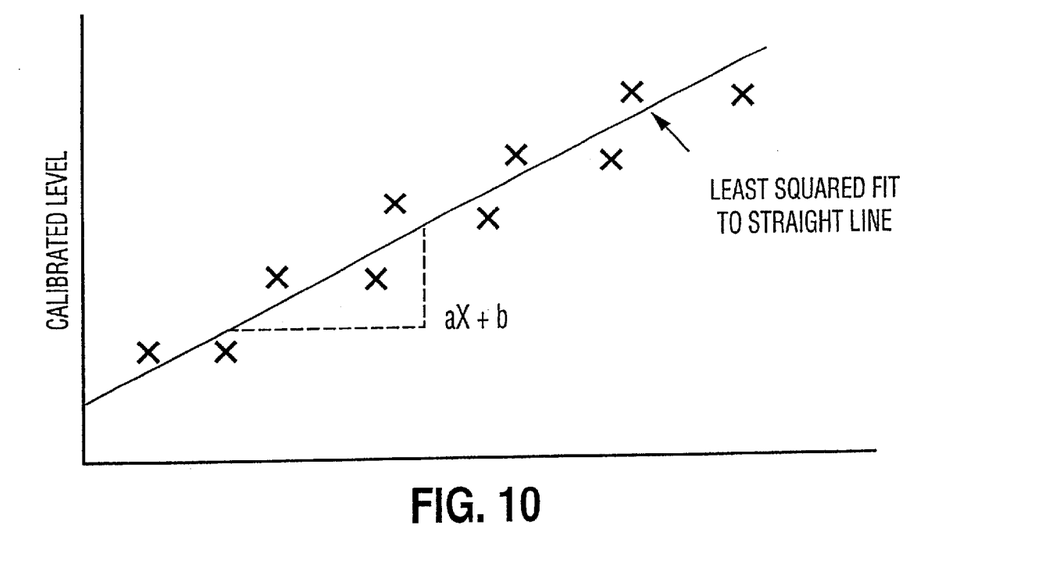
FIG. 10 graphically illustrates an exemplary amplitude calibration curve obtained by the method of FIG. 8.

Referring to FIG. 8, there is illustrated, an a flow chart, a method of spectrum amplitude calibration in accordance with an embodiment of the present invention. For the apparatus of FIG. 2, at the spectrum analyzer 12 attach "Cal Out" to "In" through a 40 dB attenuator, as shown in FIG. 9, as represented by a block 200. Set the spectrum analyzer Reference Level and Attenuation Level so that the trace falls on the bottom graticule, as represented by a block 202. Measure the voltage on the "Video Out", as represented by a block 204. Increase the spectrum analyzer Reference Level and Attenuation Level so that the trace falls on the next graticule, as represented by a block 206. Repeat steps 3 and 4 until the top graticule has been measured, as represented by a block 208. Calculate a calibration formula from the data, as represented by a block 210. The formula is a least square fit to a straight line, i.e. $Y=aX+b$, as illustrated in FIG. 7.

Once the set-up of FIG. 2 has been calibrated, thereby allowing high-speed scanning, collection of time related data becomes practical. There are two methods for collecting time related data: single probe multiple frequency (spectral); and single frequency multiple probes (spatial).

To gather single frequency multiple probe data, the spectrum analyzer Center Frequency is set to the desired frequency at zero span and the output is digitized for each probe for the duration under consideration. The start of the digitization is synchronized to the activity on the DUT. Detailed steps are given hereinbelow in Chart B.

CHART B
SINGLE FREQUENCY SCANNING

Step  Process

1. Set up the spectrum analyzer for the desired Center Frequency, Bandwidths, etc. Set it to zero span and turn the sweep off.
2. Select the desired probe.
3. Wait for a trigger signal for the DUT.
4. Digitize the 'Video Out' of the spectrum analyzer for the duration desired and save the data.
5. Select another probe and repeat steps 3–4.
6. Display the data.

To gather single probe spectral data, the spectrum analyzer is setup for the desired spectrum sweep and a single probe is selected. The spectrum analyzer sweep is triggered at time 0 of the activity on the DUT and the data collected. The spectrum analyzer is then triggered at time 0+1n sample duration(s) and process is repeated until data has been collected for the desired time intervals. Note: multiple probes could be scanned in this fashion to produce a data set of position verses time and frequency. That is a combination of the two types of scans. Detailed steps are given hereinbelow in Chart C.

CHART C
SINGLE PROBE TIME SCANNING

Step  Process

Figure 11:
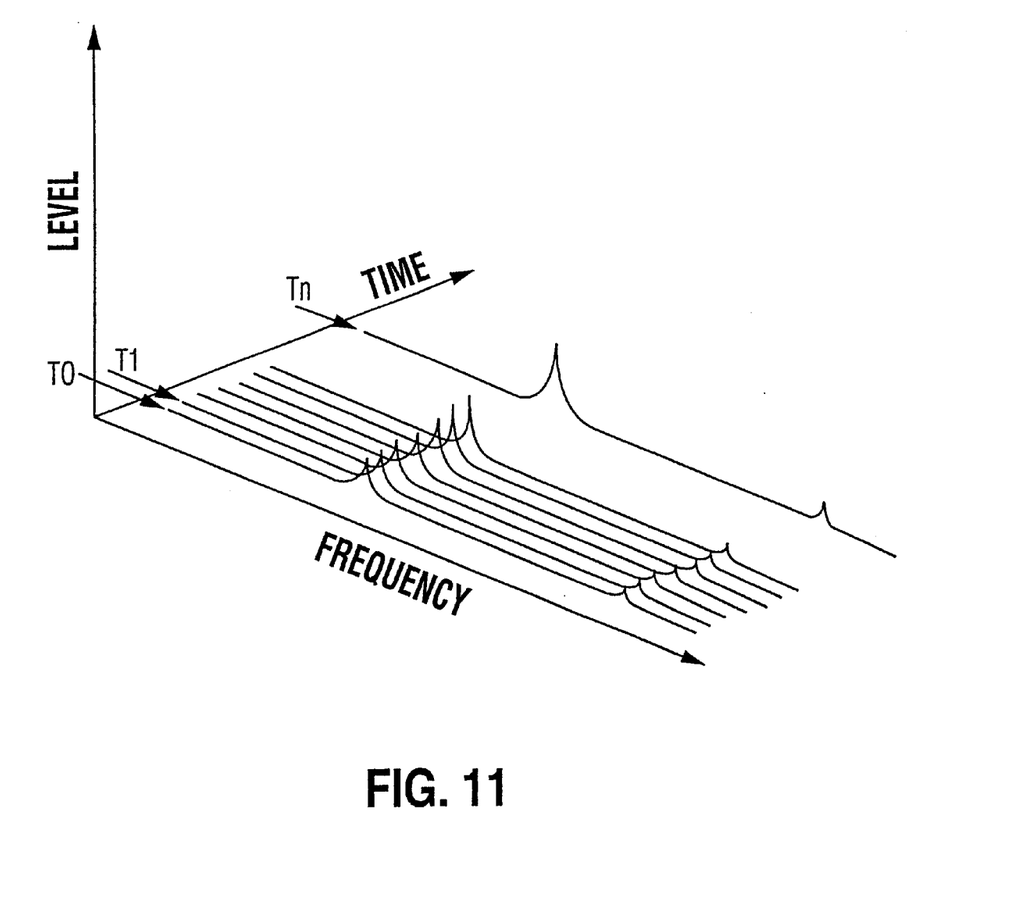
FIG. 11 graphically illustrates an exemplary time-frequency-level plot obtained by the method of Chart B.

1. Setup the spectrum analyzer and read back the sweep time. (FIG. 2)
2. Select an Emscan probe.
3. Set the 'Ready Line' and arm the Synchronizer.
4. The synchronizer waits until the DUT is ready. The spectrum analyzer's sweep and the Analog to Digital Converter (A/D) are then triggered.
5. The A/D digitizes the signal at the spectrum analyzer's 'Video Out' And 'Blanking Out' for a duration of the sweep time plus a percentage.
6. Determine the end of sweep from the digitized blanking data.
7. Linearly rescale the 'Video Out' data to correct to the number of digitized points desired.
8. Apply the Level Calibration formula to the data. Note: this formula is only determined from time to time (once per month).
9. Repeat step 3–8 waiting one sample time more each time until the desired duration has passed. (FIG. 11) The spectral data for sample time is stored in an array.
10. Run the Frequency calibration algorithm. Note: for a combination time scan, select another probe and repeat steps 2–10 until all the desired probes are scanned.
11. Display the data.

Numerous modifications, variations, and adaptations may be made to the particular embodiments of the invention described above without departing from the scope of the invention, which is defined in the claims.

What is claimed is:

1. A method for high-speed scanning of electromagnetic field levels associated with a test subject, comprising the steps of:

for each of a plurality of spatially distinct test positions on the test subject:
  (a) scanning an electromagnetic probe through a test frequency range to obtain a spectral scan representing electromagnetic field levels measured adjacent to the test position;
  (b) identifying one or more peak values associated with the spectral scan;
  (c) calculating a calibration curve fitting the peak values;
  (d) applying the calibration curve to the spectral scan to create a calibrated spectral scan; and displaying the calibrated spectral scans for the plurality of test positions to create a spectral-spatial scan for the test subject.

2. The method of claim 1, wherein step (a) comprises scanning through the test frequency range multiple times.

3. The method of claim 1, wherein step (b) comprises the steps of:

identifying one or more peak regions in the spectral scan; and for each peak region,
  selecting a first frequency window associated with the peak region, the first frequency window defining a subset of the of the test frequency range,
  obtaining a first window scan by scanning through the first frequency window, and
  identifying the peak value from the first window scan.

4. The method of claim 3, wherein the step of identifying the peak value from the first window scan comprises the steps of:

identifying a second peak region within the first window scan, the second peak region defining a subset of the first peak region;

selecting a second frequency window associated with the second peak region, the second frequency window comprising a subset of the first frequency window;

obtaining a second window scan by scanning through the second frequency window; and identifying the peak value from the second window scan.

5. The method of claim 4, wherein the step of identifying the peak value from the second window scan comprises the steps of:

identifying a third peak region within the second window scan, the third peak region defining a subset of the second peak region;

selecting a third frequency window associated with the third peak region, the third frequency window comprising a subset of the of the second frequency window;

obtaining a third window scan by scanning through the third frequency window; and identifying the peak value from the third window scan.

6. The method of claim 1, wherein the step of displaying the calibrated spectral scans for the plurality of test positions to create a spectral-spatial scan for the test subject, further comprising the steps of:

displaying a circuit map corresponding to the test subject; and displaying the calibrated spectral scans superimposed with the circuit map.

7. An apparatus operable for high-speed scanning of electromagnetic field levels associated with a test subject, the apparatus operable to perform the steps of:

for each of a plurality of spatially distinct test positions on the test subject:
  (a) scanning an electromagnetic probe through a test frequency range to obtain a spectral scan representing electromagnetic field levels measured adjacent to the test position;
  (b) identifying one or more peak values associated with the spectral scan;
  (c) calculating a calibration curve fitting the peak values;
  (d) applying the calibration curve to the spectral scan to create a calibrated spectral scan; and displaying the calibrated spectral scans for the plurality of test positions to create a spectral-spatial scan for the test subject.

8. The apparatus of claim 7, wherein step (a) comprises scanning through the test frequency range multiple times.

9. The apparatus of claim 7, wherein step (b) comprises the steps of:

identifying one or more peak regions in the spectral scan; and for each peak region,
  selecting a first frequency window associated with the peak region, the first frequency window defining a subset of the of the test frequency range,
  obtaining a first window scan by scanning through the first frequency window, and
  identifying the peak value from the first window scan.

10. The apparatus of claim 9, wherein the step of identifying the peak value from the first window scan comprises the steps of:

identifying a second peak region within the first window scan, the second peak region defining a subset of the first peak region;

selecting a second frequency window associated with the second peak region, the second frequency window comprising a subset of the first frequency window;

obtaining a second window scan by scanning through the second frequency window; and identifying the peak value from the second window scan.

11. The apparatus of claim 10, wherein the step of identifying the peak value from the second window scan comprises the steps of:

identifying a third peak region within the second window scan, the third peak region defining a subset of the second peak region;

selecting a third frequency window associated with the third peak region, the third frequency window comprising a subset of the of the second frequency window;

obtaining a third window scan by scanning through the third frequency window; and identifying the peak value from the third window scan.

12. The apparatus of claim 7, further operable for displaying the calibrated spectral scans for the plurality of test positions to create a spectral-spatial scan for the test subject by:

displaying a circuit map corresponding to the test subject; and displaying the calibrated spectral scans superimposed with the circuit map.

13. An apparatus operable for high-speed scanning of electromagnetic field levels associated with a test subject, comprising:

a plurality of probes, each probe operable for scanning through a test frequency range to measure electromagnetic field levels adjacent to the probe and within the test frequency range, each probe being positionable adjacent to a spatially distinct position on the test subject;

a synchronization block operable for synchronizing the operation of the probes;

a spectrum analyzer operable for receiving synchronized measurements from the probes and computing a synchronized set of spectral scans, each spectral scan corresponding to the measurements received from an associated probe; and a computer operable for:
  in one or more sequential sweeps, triggering the probes, the synchronization block, and the spectrum analyzer to produce synchronized electromagnetic field measurements across the test frequency range;
  for each probe:
    producing a spectral scan from the electromagnetic field measurements,
    identifying one or more peak regions in the spectral scan, and
    for each peak region,
      selecting a first frequency window associated with the peak region, the first frequency window defining a subset of the of the test frequency range,
      triggering the probe and the spectrum analyzer to produce a first window scan by scanning through the first frequency window, and
      identifying a peak value from the first window scan;
    calculating a calibration curve fitting the peak values,
    applying the calibration curve to the spectral scan to create a calibrated spectral scan; and
  displaying the calibrated spectral scans for the plurality of probes to create a spectral-spatial scan for the test subject.

14. The apparatus of claim 13, wherein the computer is further operable for displaying the calibrated spectral scans for the plurality of test positions to create a spectral-spatial scan for the test subject by:

displaying a circuit map corresponding to the test subject; and displaying the calibrated spectral scans superimposed with the circuit map.

* * * * *